Dec. 17, 1963 A. J. KODA 3,114,807

SEALED SWITCH UNIT MOUNTED ON PRINTED CIRCUIT BOARD

Filed Oct. 23, 1959

INVENTOR.
ARTHUR J. KODA
BY
Mason, Kolehmainen, Rathburn and Wyss.
ATTORNEYS.

United States Patent Office 3,114,807
Patented Dec. 17, 1963

3,114,807

SEALED SWITCH UNIT MOUNTED ON PRINTED CIRCUIT BOARD

Arthur J. Koda, Morton Grove, Ill., assignor to C. P. Clare & Company, Chicago, Ill., a corporation of Delaware Filed Oct. 23, 1959, Ser. No. 848,448
6 Claims. (Cl. 200—87)

This invention relates to a switching assembly and, more particularly, to a switching assembly in which sealed switch units are mounted on a printed circuit panel or board.

In the copending application of Arthur J. Koda, Serial No. 731,390, filed April 28, 1958, now Patent No. 3,038,-976, there is disclosed a printed circuit switch assembly in which a plurality of sealed switch units are mounted in openings in a printed circuit board and electrically and mechanically secured to the printed circuit pattern on the board by soldering the terminals of the switch units to adjacent portions of the printed circuit pattern. The assembled panel and switch units are then inserted into a common operating winding. If it is necessary to protect the components of this assembly from the adverse effects of the atmosphere, the assembly is inserted into a metal housing that can be filled with "potting" composition. Further, it is generally desirable to provide a closed housing for assemblies using mercury switches in order to avoid the possible destruction of adjacent circuit components by the mercury that can be discharged from a damaged mercury switch unit. However, the use of metallic housings increases the size and weight of the switching assembly as well as the cost thereof. In many applications in which the printed circuit relays or switching assemblies are to be used in standard printed circuit board connectors, the weight of the housed switch assembly is too great for the connector, and the size of the metal housing permits the panels or boards to be inserted only into alternate jacks in the connector with the attendant increase in the required mounting space.

Accordingly, one object of the present invention is to provide a new and improved switching assembly.

Another object of the present invention is to provide a new and improved method of making switching assemblies.

Another object is to provide a switching assembly in which a switch unit is held in position and is insulated and protected by a flexible layer of dielectric material that is bonded to the switch unit and the printed circuit board on which it is mounted.

Another object is to provide a switching assembly using printed circuit boards on which the winding for a sealed switch unit mounted on the board is held in place by a flexible layer of dielectric material that is bonded to the winding and the surface of the printed circuit board.

A further object is to provide a method of making a printed circuit relay assembly in which the components of the assembly are coated with the bonding material, and a layer of flexible dielectric material is bonded to the components and the printed circuit board to not only aid in securing the components on the board, but also to insulate and protect the printed circuit board and the components mounted thereon.

In accordance with these and many other objects, an embodiment of the present invention comprises a printed circuit panel or board that is formed with metallic or electrically conductive printed circuit patterns on one or both surfaces thereof. The panel, which is formed of a dielectric material, is provided with one or more openings adapted to receive a switch unit and a plurality of spaced apertures. The printed circuit pattern is formed so that portions thereof are disposed adjacent the edges of the opening. When the switching assembly is to be formed, an operating winding with an axially extending opening is slidably mounted on each of a plurality of sealed switch units comprising elongated glass envelopes having electrically conductive terminals projecting from one or both ends thereof. The assembled windings and sealed switch units are then each disposed in one of the openings in the printed circuit panel with at least one of the terminals engaging an adjacent portion of the printed circuit pattern. These terminals are then connected to the printed circuit pattern, thereby connecting the switching units to the printed circuit patterns and physically mounting the switch units on the printed circuit board. Furthermore, the leads to the winding are connected to portions of the printed circuit pattern to provide means for energizing these windings.

At this time, the windings mounted on the sealed switch units are retained in position only by virtue of the frictional engagement between the glass envelopes and the windings, although these windings are properly located on the switch units by engagement with the sides of the openings in which the assembled windings and switch units are disposed. In accordance with the present invention, the entire switching assembly, including the printed circuit patterns thereon, are insulated and protected and the switch units are positively secured in proper positions on the printed circuit board or panel by bonding a thin flexible layer of dielectric material to the printed circuit board and the assembled switch units and windings. This thin sheet of dielectric material protects the printed circuit pattern from excessive oxidation and electrically insulates not only the printed circuit pattern and the terminals of the sealed switch units, but also provides insulation for the windings. This layer of dielectric material is easily applied to the printed circuit panel and the switching components, does not occupy a significant amount of space, maintains the dielectric constant of the printed circuit panel and, when the sealed switch units are mercury switches, also prevents the mercury from damaged switch units from attacking adjacent switching components.

In order to apply the dielectric layer to the printed circuit panel and the components thereon, the panel surface is coated with a bonding material and this material is also applied to the windings and exposed portions of the switch units. The panel is then placed in a fixture with the coated surface adjacent, but spaced from, a sheet of plastic material. When the sheet of plastic material is softened by the application of heat, a vacuum accumulator disposed beneath the lower surface of the panel is rendered effective so that vacuum is applied to the sheet through the openings and apertures in the printed circuit board. This draws the sheet into intimate engagement with the coated upper surface of the panel and the exposed surfaces of the windings and switch units. The coating material establishes a bond between the sheet of dielectric material and the exposed surfaces of the panel including the printed circuit thereon, the windings, and the exposed portions of the sealed switch units. Because of the softened condition of the plastic sheet and the use of the vacuum, the plastic material flows into intimate engagement with all of the exposed surfaces and serves to not only electrically insulate the switching assembly, but also to seal it from the atmosphere.

The same operation described above is repeated with the printed circuit panel in reversed position so that the opposite surface of the panel and the opposite exposed surfaces of the switch units and windings are covered with a layer of dielectric material. It should be noted that when the covering material is applied to the printed circuit panel, the edge portion thereof to which the end portions of the printed circuit pattern extend is not coated. Thus, the layer of flexible dielectric material is not bonded to this end or edge portion so that it provides a male connector element.

Many other objects and advantages of the present invention will become apparent from the following detailed description when considered in conjunction with the drawings, in which.

Figure 1:
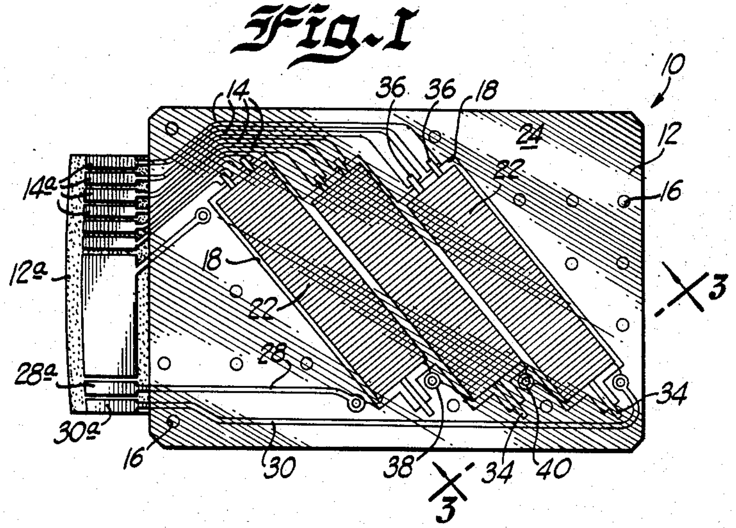
FIG. 1 is a plan view of a switching assembly embodying the present invention.
Figure 2:
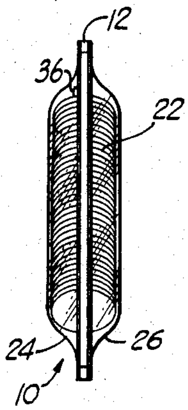
FIG. 2 is an end elevational view of the switching assembly shown in FIG. 1.

Referring now more specifically to the drawings, therein is shown a switching assembly, indicated generally as 10, which embodies the present invention and which includes a dielectric printed circuit board or panel 12 to which is secured a plurality of metallic or electrically conductive segments 14 forming a printed circuit pattern. The panel 12 is also provided with a plurality of spaced apertures 16 and three connected openings 18 adapted to receive sealed switch units. When the switch assembly 10 is to be formed, three sealed switch units 20 are inserted into the axial openings in three operating windings 22, and the assembled switch units 20 and windings 22 are positioned in the three openings 18 with one or more of the terminals of the switch units 20 engaging adjacent portions of the conductive layers or segments 14. These terminals are then soldered to the conductive segments 14 and the leads to the windings 22 are also connected to portions of the printed circuit pattern.

Figures 3, 4:
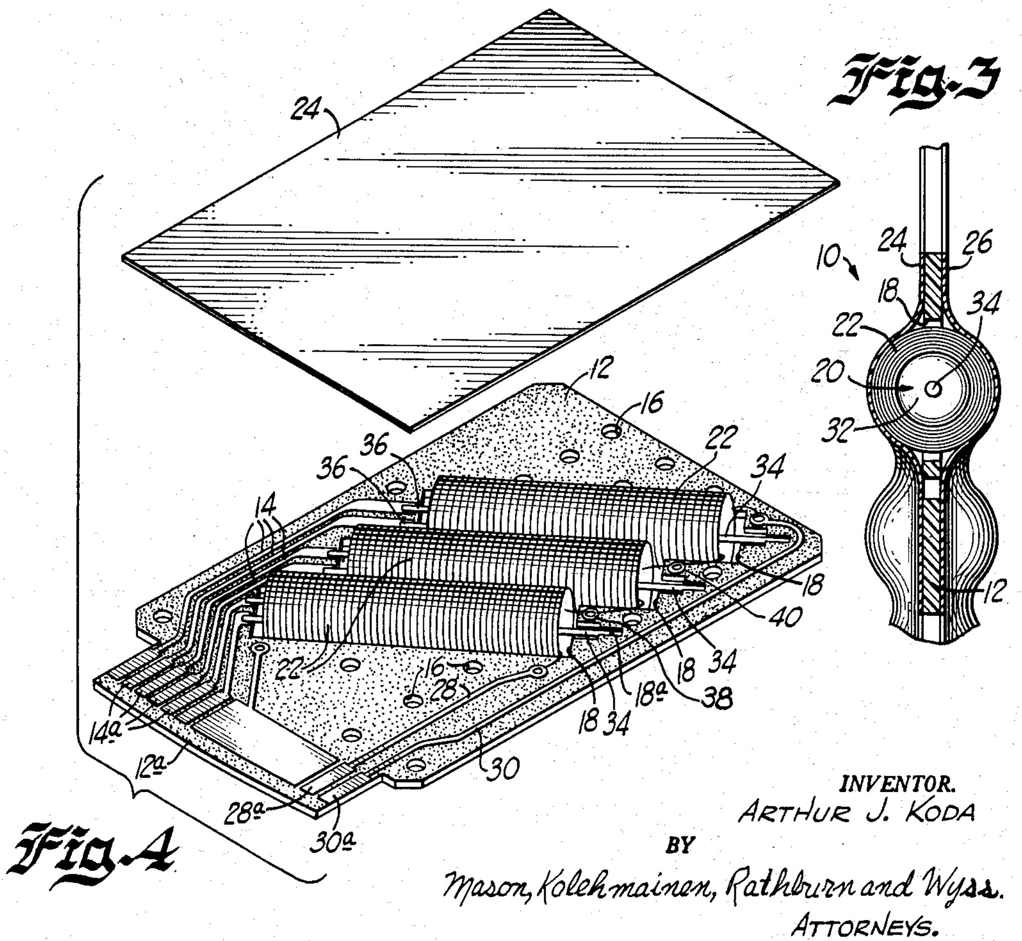
FIG. 3 is an enlarged sectional view taken along line 3—3 in FIG. 1.
FIG. 4 is an exploded view showing a layer of dielectric material positioned above the switching assembly.

To provide means for protecting and insulating the switch assembly 10 and additional means for mounting the switch units 20 and the windings 22 in a fixed position thereon, two layers 24 and 26 (FIG. 3) of dielectric material are provided. One surface of the panel 12 and the exposed surfaces of the conductive segments 14, the switch units 20, and the windings 22 are coated with a bonding material and the layer 24, for instance, is then moved into juxtaposition to the panel 12 and subjected to heat. Vacuum is then applied to the opposite side or surface of the panel 12 and is effective through the apertures 16 and the openings 18 to pull the softened layer 24 into intimate engagement with the adjacent surfaces of the assembly 10, thereby to insulate and protect this assembly and to form a bond with the windings 22 so as to secure them in a desired position on the panel 12. Similarly, the opposite surface of the panel 12 is coated with the bonding material and the layer 26 is bonded thereto to complete the protection and insulation of the switch assembly 10 and the mounting of the components thereon.

Referring now more specifically to the printed circuit panel 12, this panel is formed of any suitable dielectric material and the electrically conductive printed circuit pattern is formed on one or both surfaces of the panel by using any of the methods well known in the art. In the printed circuit panel 12 illustrated in the drawings, the conductive segments 14 are adapted to be connected to the output terminals of the switch units 20. The upper surface of the panel 12 is also provided with a pair of metallic segments 28 and 30 for extending connections to the windings 22. Each of the segments 14, 28 and 30 includes an enlarged portion **14*a*, 28*a* or 30*a* that is disposed adjacent an edge or end portion 12*a* of the panel 12 and is plated with a contact material, such as gold, to provide a male connector means. The other end portions of the segments 14 are disposed adjacent one end of the openings 18 to provide connections to the terminals of the sealed switch units 20**.

The sealed switch units 20 can comprise any one of the well known constructions, such as a mercury contact switch shown in Burton Patent No. 2,577,602, or a "dry reed" relay shown in Ellwood Patent No. 2,289,830, or a pivoted armature relay shown in a copending application of Wilhelm Juptner, Serial No. 678,236, filed August 14, 1957 now Patent No. 3,033,956, which copending application is assigned to the same assignee as the present application. In general, the switch unit 20 comprises a sealed and generally elongated dielectric envelope 32 from the opposite ends of which a plurality of electrically conductive terminals extend. In the drawings, the switch unit 20 comprises a mercury contact switch having a header or armature terminal 34 projecting from one end of the envelope 32 and at least a pair of output terminals 36 projecting from the opposite end of the envelope 32. The dielectric envelope 32 in the types of switches referred to above contains one or more magnetic switching components that are actuated by the application of a field to selectively complete or interrupt electrically conductive circuits extending between the various terminals, such as the terminals 34 and 36 or two of the terminals 36.

When the switching assembly 10 is to be fabricated, three switch units 20 are inserted into the axial openings of three operating windings or coils 22, and the assembled units 20 and coils 22 are positioned in the three openings 18 formed in the panel 12. The ends of the terminals 34 are inserted into narrow openings **18*a* extending outwardly from the openings 18, and the terminals 36 are positioned on the ends of the conductive segments 14. The terminals 36 are then electrically and mechanically connected to the printed circuit pattern by soldering the terminals 36 to the adjacent portions of the conductive segments 14. If desired, a metallic portion can be formed adjacent the openings 18*a* to provide means for mechanically securing the terminals 34 to the panel 12. To provide means for energizing the windings 22 in series, one lead of the winding 22 shown to the left in FIG. 1, is connected to the end portion of the conductive segment 28 and the other lead to this winding is soldered to a conductive segment 38 to which is also soldered one of the leads of the second winding 22. The other lead of this second winding is soldered to a conductive segment 40 to which one lead of the third winding 22 is also soldered. The other lead from the third or last winding 22 is soldered to the adjacent end of the conductive segment 30. Thus, the windings 22 are energized in series by the connection of a suitable energizing potential to the end portions 28*a* and 30*a* of the conductive segments 28 and 30**.

Following the assembly of the windings 22 and switch units 20 on the panel 12, the switch assembly 10 is insulated and protected and the windings 22 are secured in desired positions on the panel 12 by the bonding of the thin layers 24 and 26 of dielectric material thereto. To accomplish this, the upper surface, for instance, of the panel 12 shown in FIG. 4 including the conductive segments 14, 28 and 30, the exposed portions of the switch units 20, and the surfaces of the windings 22 are coated with a suitable bonding material such as an air drying cement. The end portion **12*a* and the enlarged portions 14*a*, 28*a* and 30*a* of the conductive segments 14, 28 and 30 are not coated with the bonding material inasmuch as the layer 24 does not cover this portion of the panel 12, thereby permitting the end portion 12** to be used as a male connector.

The printed circuit board 14 is then placed in a suitable locating fixture on a plastic sheet applying machine. This machine includes a vacuum line or accumulator that is placed in communication with the lower surface of the panel 12 and means for supporting the sheet or layer 24 of dielectric material in proximity to the upper surface of the panel 12 in a position interposed between this panel and a source of heat such as infrared lamps. When the layer 24, which can comprise a vinyl plastic having a thickness of .005 inch, becomes softened by the heat, the vacuum line or accumulator is rendered effective so that vacuum is applied to the layer 24 through the openings 18 and the plurality of apertures 16 to draw or pull the layer 24 into engagement with all of the exposed surfaces of the panel 12, the conductive segments 14, 28 and 30, the switch units 20, and the windings 22. Because of the softened condition of the layer 24, this sheet is drawn or flows into intimate engagement with all of the adjacent surfaces and seals the upper surface of the switch assembly 10 against the atmosphere as well as providing a dielectric covering for the upper surface of the panel. In addition, the bond produced between the layer 24 and the coated portions of the winding 22 positively secures these windings against any displacement.

After the sheet 24 has been bonded to the upper surface of the panel 12, the opposite surface of the panel 12 and the components carried thereon are coated with the bonding material, and the panel 12 is returned to the locating fixture with the coated lower surface of the panel 12 disposed adjacent the layer 26 of the dielectric material. The layer 26 is again heated, and the vacuum accumulator or line is rendered effective to pull this layer into intimate engagement with the panel 12 and the components carried thereon. If necessary, the transmission of the vacuum from the accumulator to the upper surface of the panel 12 can be facilitated by perforating the portions of the layer 24 that cover the openings 26. After the dielectric layer 26 is applied to the other side of the panel 12, any excess material from the sheets 24 and 26 is removed.

Accordingly, in the switching assembly and by the method of making switching assemblies embodying the present invention, the problems involved in providing a small and easily assembled switching means including a plurality of sealed switch units is overcome by the use of the layers of dielectric material that are bonded to the surfaces of the printed circuit board. The switching components, the conductive portions of the printed circuit pattern, and the additional electrical conductors for the leads to the windings are electrically insulated and mechanically protected without the use of bulky and heavy housings or separate insulating tubes or coverings. Further, the use of the dielectric layers provides means for insuring the proper disposition and support of components carried on the printed circuit board.

Although the present invention has been described with reference to a single embodiment thereof, it will be understood that many other modifications and embodiments can be devised by those skilled in the art that will fall within the spirit and scope of the principles of this invention.

What is claimed and desired to be secured by Letters Patent of the United States is:

1. An assembly comprising a generally uniplanar dielectric panel; a plurality of thin metallic layers secured to at least one surface of said panels; an electrical component positioned on said panel and including at least one terminal connected to one of said thin metallic layers, the structure of the electrical component rising above the plane of the panel; connector means on the panel connected to at least one of the metallic layers; and a thin and flexible layer of dielectric material secured to and covering said thin metallic layers, said surface of said panel, and said electrical component, said layer of dielectric material comprising a preformed sheet of such flexibility and thinness that the outline of the covered structure of the electrical component remains distinct above the covered surface of the panel, said layer of dielectric material also being spaced from the connector means to permit electrical connections to be made to the assembly.

2. The assembly set forth in claim 1 in which said connector means includes a portion at one edge of the panel to which the ends of at least some of the thin metallic layers extend and which is spaced outwardly away from the adjacent edge of the layer of dielectric material to permit electrical connections to be made to said metallic layers.

3. A switching assembly comprising a generally uniplanar dielectric panel defining an opening, a plurality of metallic layers secured to at least one surface of said panel and including at least one portion extending to a point adjacent said opening, a sealed switch unit including a terminal and disposed in said opening, means electrically and mechanically connecting said terminal to said one portion to suspend said switch unit in said opening, a winding surrounding at least a portion of said switch unit and disposed in said opening with a portion of the winding projecting above the plane of the panel, connector means carried on the panel and connected to at least one of the metallic layers, and a thin and flexible layer of dielectric material secured to and covering said panel and said winding to secure said winding to said panel, said layer of dielectric material comprising a preformed sheet of generally uniform thickness so that the outline of the projecting portion of the winding projects above the covered surface of the panel, said layer of dielectric material also being spaced from the connector means to permit electrical connections to be made to the switching assembly.

4. A switching assembly comprising a generally uniplanar dielectric panel with a plurality of metal layers secured to spaced portions of at least one surface of the panel; a sealed switch unit positioned on the panel and including at least one electrically conductive terminal secured to one of the metal layers; winding means around at least a portion of the sealed switch unit, the structure of said winding rising above the surface of the uniplanar panel; connector means carried on the panel and electrically connected to at least some of the metal layers; and a thin and flexible layer of dielectric material bonded to and covering the surface of the panel, the winding means, and the metal layers to provide electrical insulation therefor and to secure said winding in position, said dielectric material being spaced from the connector means and comprising a preformed sheet closely adhering to the surfaces of the panel and winding means so that the covered configuration of the winding is clearly visible above the covered surface of the panel.

5. A switching assembly comprising a dielectric panel with a plurality of metal layers secured to spaced portions of at least one surface of the panel; a sealed switch unit positioned on the panel and including a sealed glass housing and at least one electrically conductive terminal secured to one of the metal layers; winding means around at least a portion of the sealed switch unit; connector means carried on the panel and electrically connected to at least some of the metal layers; and a thin and flexible layer of dielectric material adhered to and covering the surface of the panel, the winding means, the terminal, and the metal layers to provide electrical insulation therefor and to secure said winding in position, said dielectric material comprising a preformed sheet of material having a thickness on the order of .005 inch so that the covered configuration of the winding means is clearly visible above the covered surface of the panel and being spaced from the connector means to permit electrical connections to be made to the switching assembly.

6. A switching assembly comprising a uniplanar dielectric panel of a given thickness and having a plurality of metal layers secured to spaced portions of at least one surface of the panel; a sealed switch unit positioned on the panel and including at least one electrically conductive terminal secured to one of the metal layers; winding means around at least a portion of the sealed switch unit; connector means carried on the panel and electrically connected to at least some of the metal layers; and a thin and flexible layer of dielectric material adhered to and covering the surface of the panel, the winding means, and the metal layers to provide electrical insulation therefor and to secure said winding in position, said dielectric material comprising a preformed sheet of generally uniform thickness substantially less than the given thickness so that the covered configuration of the winding means is clearly visible above the covered surface of the panel and being spaced from the connector means to permit electrical connections to be made to the switching assembly.

References Cited in the file of this patent

UNITED STATES PATENTS

| | | |
|---|---|---|
| 2,630,506 | Buch | Mar. 3, 1953 |
| 2,651,833 | Kernahan | Sept. 15, 1953 |
| 2,683,839 | Beck | July 13, 1954 |
| 2,757,443 | Steigerwalt | Aug. 7, 1956 |
| 2,894,077 | McCoy | July 7, 1959 |
| 2,903,536 | McBrian | Sept. 8, 1959 |
| 2,903,627 | McGarvey | Sept. 8, 1959 |
| 2,923,860 | Miller | Feb. 2, 1960 |
| 2,981,868 | Severson | Apr. 25, 1961 |
| 2,989,665 | Khouri | June 20, 1961 |
| 3,030,451 | Jacobson | Apr. 17, 1962 |
| 3,038,976 | Koda | June 12, 1962 |